(12) United States Patent
Wang et al.

(10) Patent No.: US 10,838,005 B2
(45) Date of Patent: Nov. 17, 2020

(54) DIFFERENTIAL VOLTAGE MEASURING DEVICE

(71) Applicant: Yazaki Corporation, Tokyo (JP)

(72) Inventors: Jian Wang, Susono (JP); Hironao Fujii, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 120 days.

(21) Appl. No.: 15/730,880

(22) Filed: Oct. 12, 2017

(65) Prior Publication Data

US 2018/0164373 A1 Jun. 14, 2018

(30) Foreign Application Priority Data

Dec. 9, 2016 (JP) ................................. 2016-238980

(51) Int. Cl.
| | | |
|---|---|---|
| *G01R 31/378* | (2019.01) | |
| *G01R 31/317* | (2006.01) | |
| *G01R 31/396* | (2019.01) | |
| *G01R 19/165* | (2006.01) | |
| *G01R 19/10* | (2006.01) | |
| *G01R 31/389* | (2019.01) | |

(Continued)

(52) U.S. Cl.
CPC ....... *G01R 31/31706* (2013.01); *G01R 19/10* (2013.01); *G01R 19/16542* (2013.01); *G01R 31/378* (2019.01); *G01R 31/389* (2019.01); *G01R 31/396* (2019.01); *H01M 10/4264* (2013.01); *H01M 10/48* (2013.01); *H01M 2010/4271* (2013.01); *H01M 2220/20* (2013.01)

(58) Field of Classification Search
CPC .... G01R 31/396; G01R 31/378; G01R 19/10; G01R 19/16542; H01M 10/4264; H01M 10/48; H01M 2010/4271; H01M 2220/20
See application file for complete search history.

(56) References Cited

U.S. PATENT DOCUMENTS

| | | | | |
|---|---|---|---|---|
| 2003/0226082 A1* | 12/2003 | Kim | ..................... | G06K 19/073 714/734 |
| 2004/0145371 A1* | 7/2004 | Bertness | .............. | G01R 31/385 324/426 |

(Continued)

FOREIGN PATENT DOCUMENTS

| | | |
|---|---|---|
| CN | 103080758 A | 5/2013 |
| CN | 103378722 A | 10/2013 |

(Continued)

*Primary Examiner* — Jeff W Natalini

(74) *Attorney, Agent, or Firm* — Sughrue Mion, PLLC

(57) ABSTRACT

A differential voltage measuring device includes a first capacitor and a second capacitor each formed of a ceramic capacitor, a differential amplifier for outputting a voltage corresponding to a difference voltage between a voltage held by the first capacitor and a voltage held by the second capacitor, and μCOM for introducing a first voltage to the first capacitor, and a second voltage to the second capacitor with the first capacitor holding the first voltage, and μCOM introduces a third voltage to at least the first capacitor or the second capacitor, and after application of the third voltage stops, introduces the first voltage to the first capacitor or the second capacitor to which the third voltage was introduced.

11 Claims, 5 Drawing Sheets

(51) Int. Cl.
*H01M 10/42* (2006.01)
*H01M 10/48* (2006.01)

(56) References Cited

U.S. PATENT DOCUMENTS

| | | | | |
|---|---|---|---|---|
| 2005/0189949 | A1* | 9/2005 | Shimizu | G01R 31/3835 |
| | | | | 324/434 |
| 2011/0273192 | A1* | 11/2011 | Huang | G06F 3/044 |
| | | | | 324/678 |
| 2012/0025768 | A1* | 2/2012 | Nakano | H02J 7/345 |
| | | | | 320/116 |
| 2013/0082715 | A1 | 4/2013 | Kawamura | |
| 2013/0272054 | A1 | 10/2013 | Daudelin et al. | |
| 2014/0046611 | A1* | 2/2014 | Bloemendaal | G01N 27/223 |
| | | | | 702/65 |
| 2014/0097852 | A1* | 4/2014 | Mizoguchi | G01R 31/3835 |
| | | | | 324/434 |
| 2015/0188329 | A1* | 7/2015 | Bradley | G01R 31/389 |
| | | | | 320/107 |
| 2016/0056643 | A1 | 2/2016 | Syouda | |

FOREIGN PATENT DOCUMENTS

| | | |
|---|---|---|
| JP | 2004-247719 A | 9/2004 |
| JP | 2009-53012 A | 3/2009 |
| JP | 2014-219311 A | 11/2014 |

\* cited by examiner

DIFFERENTIAL VOLTAGE MEASURING DEVICE

TECHNICAL FIELD

The present invention relates to a technique for improving measurement accuracy of a voltage difference between a first voltage and a second voltage to be sequentially acquired.

BACKGROUND ART

For example, in various vehicles such as an electric vehicle (EV) that travels using an electric motor, a hybrid vehicle (HEV) that travels with the combined use of a combustion engine and the electric motor, or the like, secondary batteries such as lithium ion rechargeable batteries or nickel hydrogen rechargeable batteries are installed as a power source for the electric motor.

It is known that such secondary battery is deteriorated by repeating charging and discharging, and the storageable capacity (current capacity, electric power capacity, etc.) gradually decreases. Then in the electric vehicle using the secondary battery, the storageable capacity is sought by detecting the degree of deterioration of the secondary battery, and thus the travelable distance by the secondary battery, the lifetime of the secondary battery or the like is calculated.

As one indicator indicative of the degree of deterioration of the secondary battery, there is SOH (State of Health) which is the ratio of the current chargeable capacity with respect to the initial storable capacity. It is known that this SOH correlates with an internal resistance of the secondary battery. Therefore, detecting the internal resistance of the secondary battery allows for obtaining SOH based on this internal resistance.

In general, while it was difficult to obtain sufficient detection accuracy since the internal resistance is very small, Patent Literature 1 discloses a battery state detection device with improved detection accuracy of internal resistance.

FIG. 6 illustrates a diagram showing a schematic configuration of a battery state detection device 500 described in Patent Document 1. The secondary battery B to be detected has an electromotive force portion e generating a voltage and an internal resistance r. Detection of this internal resistance r enables to obtain the SOH of the secondary battery B.

The secondary battery B generates a voltage V between both electrodes (a positive electrode Bp and a negative electrode Bn), the voltage V is determined by a voltage Ve generated by the electromotive force at the electromotive force portion e and a voltage Vr generated by flowing current through the internal resistance r (V=Ve+Vr). The negative electrode Bn of the secondary battery B is connected to the reference potential G.

The battery state detection device 500 includes a differential amplification unit 511, a changeover switch 512, a first capacitor 513, a second capacitor 514, a charging unit 515, a first analog-to-digital conversion (ADC) 521, a second analog-to-digital converter (ADC) 522, and a microcomputer (μCOM) 540.

In the configuration shown in this figure, when the μCOM 540 transmits a control signal of charging start through the output port PO2 to the charging unit 515, the charging unit 515 starts flowing a predetermined constant current Ic to the secondary battery B. As a result, charging the secondary battery B starts.

When charging starts, the μCOM 540 controls the changeover switch 51 through the output port PO2 so that the positive electrode Bp of the secondary battery B and the first capacitor 513 are connected. As a result, the voltage V1=Ve+r·Ic between the two electrodes of the secondary battery B during charging is held in the first capacitor 513.

Next, the μCOM 540, when the voltage between both electrodes of the secondary battery B acquired through the input port PI1 reaches the predetermined state detection voltage, controls the changeover switch 512 through the output port PO1, so that the positive electrode Bp of the secondary battery B and the second capacitor 514 are connected, and transmits a control signal of charging stop to the charging unit 515 through the output port PO2.

As a result, when the charging current Ic to the secondary battery B stops and the storage state of the second capacitor 514 becomes stable, the voltage V2=Ve between both electrodes of the secondary battery B is held in the second capacitor 514.

In this state, the μCOM 540 detects the amplified voltage Vm the differential amplifier 511 outputs through the input port PI 2. Then, the detected amplified voltage Vm is divided by the rate Av of the differential amplifier 511 and further divided by the charging current Ic, thus the internal resistance r (=(Vm/Av)/Ic) is detected.

Finally, the μCOM 540 transmits the control signal of charging start to the charging unit 515 through the output port PO2. The charging unit 515 starts to flow the predetermined constant charging current Ic again into the secondary battery B according to this control signal. As a result, charging is resumed and the battery state detection process finishes.

CITATION LIST

Patent Document

Patent Document 1: Japanese Unexamined Patent Application Publication No. 2014-219311

DISCLOSURE OF THE INVENTION

Problems to be Resolved by the Invention

With the battery state detection device 500 described in Patent document 1, detection accuracy of the internal resistance of the secondary battery can improve, and suppress the deterioration of the detection accuracy of the battery state.

Further, by applying the technique of the battery state detection device 500, it is possible to configure differential voltage measuring apparatus which can measure not only the internal resistance of the secondary battery, but a minute voltage change between the first state and the second state in a voltage source such as a battery or a potential difference of two points in the circuit, etc. can be measured with a high degree of accuracy.

That is, the voltage of the voltage source in the first state or the voltage of one point in the circuit is sampled and held as the first voltage with the switch 512 and the capacitor 513, and then the voltage of the voltage source in the second state or the voltage at another point in the circuit is sampled and held as the second voltage with the switch 512 and the second capacitor 514, before the difference between the first voltage and the second voltage is amplified by the differential amplifier 511, and the amplification voltage Vm the amplification unit 511 outputs is divided by the amplification factor Av of the differential amplification unit 511, and thus a minute voltage change between the first state and the second state in the voltage source or one point and another point in the circuit can be measured with high accuracy.

In the example described in Patent Document 1, the state where the constant current Ic flows through the secondary battery B corresponds to the first state, and the state where no current flows corresponds to the second state. Note that a certain voltage source as a detection target of voltage change is not limited to the secondary battery, but may be a cell constituting a primary battery, or an assembled battery, a power supply circuit, or the like.

Now, in an actual capacitor, a phenomenon occurs that accumulated charge is released due to a minute leak current. Therefore, after the voltage of the battery in the first state is sampled and held by the first capacitor 513 until sampling and holding of the voltage of the battery in the second state by the second capacitor 514 finishes, the charge accumulated in the first capacitor 513 slightly escapes due to the leakage current. When the charge is released from the first capacitor 513, the first voltage is lower than the actual voltage, which results in a decrease in measurement accuracy.

Further, in order to reduce the cost and size of this type of apparatus, it is preferable to use a ceramic capacitor for the first capacitor 513 or the second capacitor 514. However, ceramic capacitor has the DC bias characteristic that the electrostatic capacity decreases as the voltage increases. Due to this characteristic DC bias characteristic, when the sampled and held charge becomes escaped due to leak current, the first voltage decreases and the electrostatic capacitance increases, so that the reduction of the first voltage further progresses, posing a problem that the measurement accuracy further deteriorates. Therefore, it was difficult in the conventional method to use ceramic capacitor.

In view of the above, the object of the present invention is to provide a differential voltage measuring apparatus capable of suppressing deterioration in the measurement accuracy of the voltage difference between the first voltage and the second voltage sequentially acquired and reducing the cost and size of the apparatus.

Means for Solving the Problems

In order to solve the above problem, the differential voltage measuring device of the present invention is constituted by a first capacitor and a second capacitor each formed of a ceramic capacitor; a differential amplifier for outputting a voltage corresponding to a difference voltage between a voltage held by the first capacitor and a voltage held by the second capacitor, and a control unit for introducing a first voltage to the first capacitor, and a second voltage to the second capacitor with the first capacitor holding the first voltage, and the control unit introduces a third voltage to at least the first capacitor, and after application of the third voltage stops, introduces the first voltage to the first capacitor to which the third voltage was introduced. In addition, the second capacitor may have a smaller capacity than the first capacitor. In addition, the control unit connects a connection destination of an input terminal to which voltage is applied to the first capacitor and the second capacitor exclusively, and thereby introducing the first voltage or the third voltage to the first capacitor and the second voltage or the third voltage to the second capacitor with the first capacitor holding the first voltage or the third voltage. Further, further a current output unit switching and outputting a first current supplied to generate the first voltage, a second current supplied to generate the second voltage, and a third current supplied to generate the third voltage may be comprised.

Advantages of the Invention

According to the present invention, at least one of the first capacitor and the second capacitor is introduced with the third voltage, the first capacitor or the second capacitor is introduced with the first voltage or the second voltage to the second capacitor after the lapse of the predetermined time after stopping the application of the third voltage. By doing like this, it is possible to derive the first voltage and the second voltage after changing the DC bias characteristic of the ceramics capacitor. Therefore, an increase in the electrostatic capacitance following the voltage drop due to the influence of the DC bias characteristic of the ceramic capacitor is suppressed, and furthermore, the decrease in the voltage across the capacitor is reduced, enabling to suppress a decrease in measurement accuracy of the voltage difference between the first voltage and the second voltage. Also, since the ceramic capacitor is used, cost reduction and miniaturization of the apparatus can be designed.

MODE FOR CARRYING OUT THE INVENTION

Figure 1:
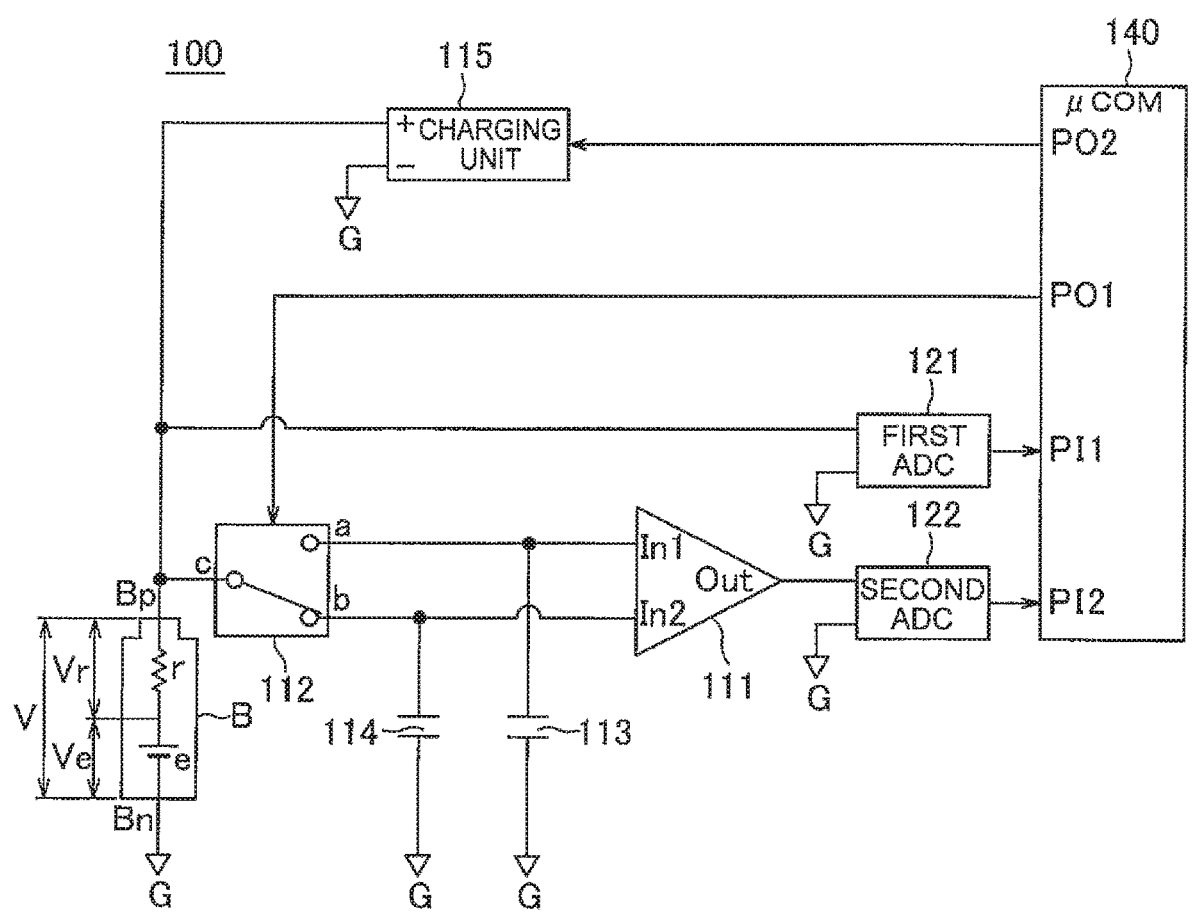
FIG. 1 is a diagram showing a schematic configuration of a battery state detection device according to a first embodiment.

Embodiments of the present invention will be described in detail with reference to the drawings. The first embodiment is an example in which the differential voltage measuring device is applied to a battery state detection device. FIG. 1 is a diagram showing a schematic configuration of a battery state detection device that is a first embodiment of the present invention.

The battery state detection device 100 of the present embodiment is mounted on an electric vehicle, for example, is connected between the electrodes of the secondary battery provided in the secondary battery an electric vehicle includes, and detects the internal resistance of the secondary battery as a state of this secondary battery. It is needless to say that a device, a system, etc. equipped with the secondary battery other than the electric vehicle may be applied thereto.

The secondary battery B to be detected has an electromotive force portion e generating a voltage and an internal resistance r. By detecting the internal resistance r, the SOH of the secondary battery B can be obtained.

The secondary battery B generates a voltage V between both electrodes (a positive electrode Bp and a negative electrode Bn), which is determined by the voltage Ve generated by the electromotive force generated by the electromotive force portion e and the voltage Vr generated by a current flowing through the internal resistance r (V=Ve+Vr). The negative electrode Bn of the secondary battery B is connected to the reference potential G.

As shown in the figure, the battery condition detection device 100 includes a differential amplifier 111, a changeover switch 112, a first capacitor 113, a second capacitor 114, a charging unit 115, a first analog-digital converter (ADC) 121, a second analog-to-digital converter (ADC) 122, and a microcomputer (μCOM) 140.

The differential amplifier 111 is constituted by, for example, an operational amplifier or the like, and has two input terminals (a first input terminal In1 and a second input terminal In2) and one output terminal (output terminal Out), and outputs from the output terminal the voltage Vm obtained by amplifying the difference value of the voltage input to these two input terminals with a predetermined amplification factor Av.

The changeover switch 112 is, for example, one circuit 2-contact (SPDT (single pole double throw)) switch constituted by an analog switch or the like. A changeover switch a of two changeover terminals a and b in the changeover switch 112 is connected to the first input terminal In1 of the differential amplifier 111 and the changeover terminal b is connected to the second input terminal In2 of the differential amplifier 111. Further, the common terminal c in the changeover switch 112 is connected to the positive electrode Bp of the secondary battery B.

The changeover switch 112 is connected to an output port PO1 of the μCOM 140 described later, the connection between the two changeover terminals a, b and the common terminal c is switched in accordance with the control signal from the μCOM 140, the positive electrode Bp of the secondary battery B is connect exclusively to either the first input terminal In1 or the second input terminal In2.

The first capacitor 113 is connected between the first input terminal In1 of the differential amplifier 111 and the reference potential G. That is, the first capacitor 113 is disposed between the first input terminal In1 and the negative electrode Bn of the secondary battery B. As a result, the first capacitor 113 holds the voltage between the force terminal In1 and the negative electrode Bn of the secondary battery B.

The second capacitor 114 is connected between the second input terminal In2 of the differential amplifier 111 and the reference potential G. That is, the second capacitor 114 is disposed between the second input terminal In2 and the negative electrode Bn of the secondary battery B. As a result, the second capacitor 114 holds the voltage between the second terminal In2 and the negative electrode Bn of the secondary battery B.

Here, in the battery condition detection device 100 of the present embodiment, the first capacitor 113 and the second capacitor 114 are each composed of a ceramic capacitor. In addition, the capacitances of the first capacitor 113 and the second capacitor 114 are different from each other, the capacitance of the first capacitor 113 accumulating electric charge firstly is designed to be larger than the capacity of the second capacitor 114. Generally, with capacitors, the larger the capacitance, the smaller the effect of voltage drop due to leakage current, and the smaller the capacity, the shorter the time required for sample hold.

In the present embodiment, the capacitance of the first capacitor 113 and the capacitance of the second capacitor 114 are different, but they may have the same capacity.

The charging unit 115 is connected between the positive electrode Bp of the secondary battery B and the reference potential G in order to allow a predetermined charging current Ic to flow in the secondary battery B in charging the secondary battery B. Therefore, it can function as a current output unit. The charging unit 115 is connected to an output port PO2 of the μCOM 140 which will be described later, the charging current Ic is flowed through the secondary battery B in accordance with the control signal, and to stop flowing the charging current I through the secondary battery B stops charging.

The first analog-to-digital converter (ADC) 121 quantizes the voltage between both electrodes of the secondary battery B, and outputs a signal indicating a digital value corresponding to this voltage. The analog-to-digital converter (ADC) 122 quantizes the amplified voltage Vm output from the differential amplifier 111, and outputs a signal indicating a digital value corresponding to the amplified voltage Vm.

The μCOM 140 has a built-in CPU, ROM, RAM, and the like, functions as a controller, and controls the entire battery state detection device 100. The μCOM 140 is provided with a first output port PO1 connected to the changeover switch 112, and a second output port PO2 connected to the charging unit 115, sends a control signal to the changeover switch 112 through the first output port PO1, controls the changeover switch 112 so as to connect the positive electrode Bp of the secondary battery B and the first input terminal In1 while the secondary battery B is being charged, and connect the positive electrode Bp of the secondary battery B and the second input terminal In2 while charging of the secondary battery B is stopped.

Further, a control signal is transmitted to the charging unit 115 through the second output port PO 2, and the charging unit 115 is controlled so as to stop charging the secondary battery B when the voltage V between both electrodes of the secondary battery B reaches the predetermined state detection voltage Vt during the charging of the secondary battery B by the charging unit 115.

The μCOM 140 has a first input port PI1 to which a signal output from the first ADC 121 is input, and a second input port PI2 to which a signal output from the second ADC 122 is input. On the basis of these signals, the μCOM 140 detects the voltage V between the two electrodes of the secondary battery B and the amplified voltage Vm output from the differential amplifier 111. Then, the internal resistance r of the secondary battery B is detected on the basis of the amplified voltage Vm and the charging current Ic.

Figure 2:
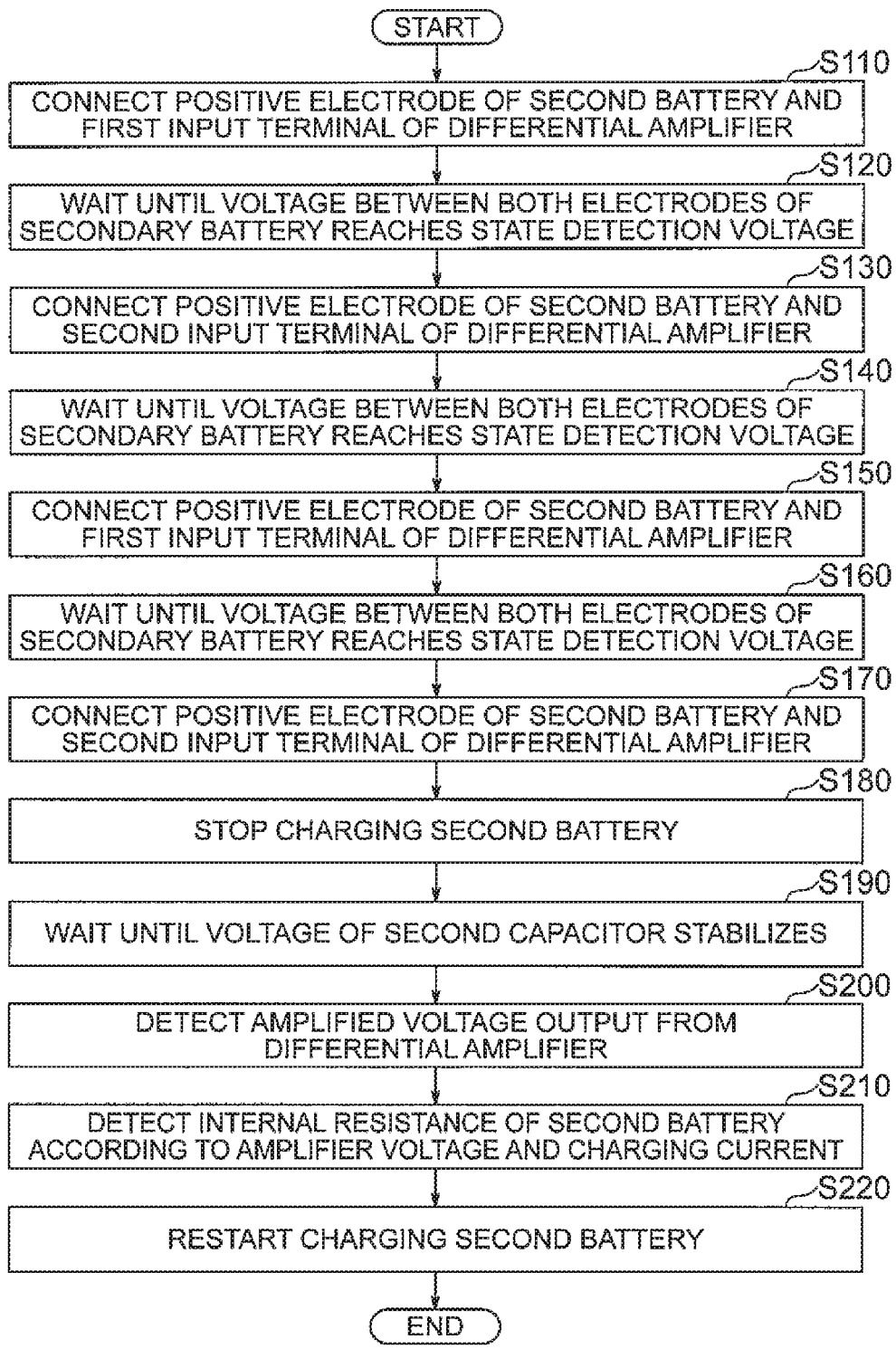
FIG. 2 is a flowchart showing an example of a battery state detection process in the battery state detection device.

Next, with reference to the flowchart of FIG. 2, will be described an example of the battery state detection process in the μCOM 140 included in the battery condition detection device 100 according to the first embodiment.

The μCOM 140, for example, upon receipt of the charge start command of the secondary battery B from an electronic control unit mounted on a vehicle through a communication port, transmits a control signal for starting charging to the charging unit 115 through the second output port PO2. In accordance with this control signal, the charging unit 115 starts to supply a predetermined constant charging current Ic to the secondary battery B. As a result, charging of the secondary battery B starts.

When the charge current Ic flows through the secondary battery B and the battery is being charged, the μCOM 140 transmits a control signal for connecting the changeover terminal a and the common terminal c to the changeover switch 112 through the control terminal PO1 (S110).

The changeover switch 112 connects the changeover terminal a and the common terminal c according to this control signal, so that the positive electrode Bp of the secondary battery B and the first input terminal In1 of the differential amplifying section 111 are connected.

As a result, the first capacitor 113 is connected between the positive electrode Bp and the negative electrode Bn of the secondary battery B, and charges flow into the first capacitor 113 from the secondary battery B and the charging unit 115. When a certain amount of time elapses, the first capacitor 113 accumulates charges up to its capacity upper limit, in addition, the voltage (third voltage) between both electrodes of the secondary battery B during charging is stored in the first capacitor 113 is held.

Next, the μCOM 140 waits until the voltage between both electrodes of the secondary battery B reaches the state detection voltage Vth (S120). When the voltage between the both electrodes of the secondary battery B reaches the predetermined state detection voltage Vth, the μCOM 140 transmits a control signal the changeover switch 112 for connecting the changeover terminal b and the terminal c through the first output port PO1 (S130).

The changeover switch 112 connects the changeover terminal b and the common terminal c according to this control signal, so that the positive electrode Bp of the secondary battery B and the second input terminal In2 of the differential amplification section 111 are connected.

As a result, the second capacitor 114 is connected between the positive electrode Bp and the negative electrode Bn of the secondary battery B, and charges flow into the second capacitor 114 from the secondary battery B and the charging unit 115. When a certain amount of time elapses, the second capacitor 114 accumulates charges up to its capacity upper limit, in addition, the voltage (third voltage) between both electrodes of the secondary battery B during charging is stored in the second capacitor 114 is held.

Next, the μCOM 140 waits until the voltage between both electrodes of the secondary battery B reaches the state detection voltage Vth (S140). Up to this point, pre sample and hold operation is performed for the first capacitor 113 and the second capacitor 114. As for the effect of this pre sample and hold operation will be described later.

When the voltage between the both electrodes of the secondary battery B reaches the predetermined state detection voltage Vth, the μCOM 140 transmits a control signal for connecting the changeover terminal a and the common terminal c to the changeover switch 112 through the control terminal PO1 (S150).

The changeover switch 112 connects the changeover terminal a and the common terminal c according to this control signal, so that the positive electrode Bp of the secondary battery B and the first input terminal In1 of the differential amplifying section 111 are connected.

As a result, the first capacitor 113 is connected between the positive electrode Bp and the negative electrode Bn of the secondary battery B, and charges flow into the first capacitor 113 from the secondary battery B and the charging unit 115. When a certain amount of time elapses, the first capacitor 113 accumulates charges up to its capacity upper limit, in addition, the voltage between both electrodes of the secondary battery B during charging is stored in the first capacitor 113 is held as the first voltage.

Next, the μCOM 140 waits until the voltage between both electrodes of the secondary battery B reaches the state detection voltage Vth (S160). When the voltage between the both electrodes of the secondary battery B reaches the predetermined state detection voltage Vth, the μCOM 140 transmits a control signal the changeover switch 112 for connecting the changeover terminal b and the terminal c through the first output port PO1 (S170), and nearly the same time transmits a control signal for stopping charging to the charging unit 115 through the second output port PO2.

The changeover switch 112 connects the changeover terminal b and the common terminal c according to this control signal, so that the positive electrode Bp of the secondary battery B and the second input terminal In2 of the differential amplification section 111 are connected.

As a result, the second capacitor 114 is connected between the positive electrode Bp and the negative electrode Bn of the secondary battery B, and charges flow into the first capacitor 114 from the secondary battery B. In addition, the charging unit 115 stops charge current Ic to the second battery B in accordance with the control signal from the μCOM 140.

While the second capacitor 114 and the secondary battery B are connected by the changeover switch 112, although the first capacitor 113 is disconnected from the secondary battery B, the amount of charge escaping due to leakage current can be reduced because the amount of the first capacitor 113 is designed to be large.

Then, the second capacitor 114 waits for the power storage period set for accumulating charge to the capacity upper limit to elapse (S190). The second capacitor 114 can store electric charge to the capacity upper limit in a short time because capacity is designed to be small. For this reason, it is possible to further reduce the amount of electric charge that escapes through the capacitor 113.

When this storage period has elapsed, the second capacitor 114 stores electric charge to the upper limit of its capacity, the voltage held by the secondary battery B is stabilized, and the voltage between both electrodes of the secondary battery B is held as the second voltage in the second capacitor 114.

Next, when the voltage held by the second capacitor is stabilized (that is, when the storage period has elapsed), the μCOM 140 detects the amplified voltage Vm output from the differential amplifier 111 based on the information obtained from the signal input to the second input port PI2 (S200).

The μCOM 140 divides the detected amplified voltage Vm by the amplification factor Av of the differential amplifier 111, further by the charging current Ic, and thus the internal resistance r of the secondary battery B is detected (r=(Vm/Av)/Ic) (S210).

Finally, the μCOM 140 transmits a control signal for charge start to the charging unit 115 through the second output port PO2 (S220). In accordance with this control signal, the charging unit 115 again stars again flowing a predetermined constant charging current Ic to the secondary battery B. As a result, charging is resumed, and the battery state detection process is terminated.

As described above, in the battery state detection device 100 according to the present embodiment, as in step S120 or S140, once a voltage is applied to the first capacitor 113 and the second capacitor 114 (as pre sample and hold), the first voltage and the second voltage for detecting the internal resistance r is held (sample and hold). Thus, the possibility that the detection accuracy of the internal resistance r decreases due to the influence of the DC bias characteristics of the ceramic capacitor can be reduced.

Figure 3:
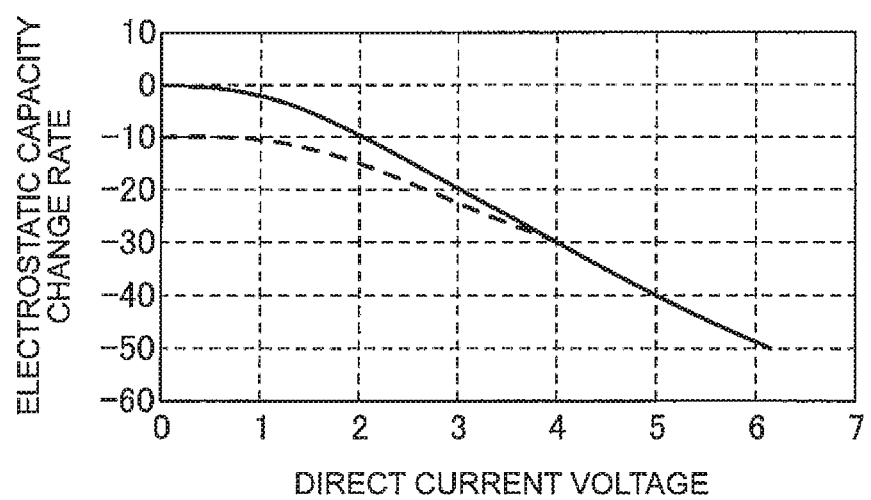
FIG. 3 is a graph showing an example of DC bias characteristic of a ceramic capacitor.

FIG. 3 shows an example of the DC bias characteristics of the ceramic capacitor. In FIG. 3, the vertical axis represents a change rate of the electrostatic capacity, and the horizontal axis the DC voltage. The solid line in FIG. 3 indicates characteristics when pre-sample hold is not performed, and the dotted line characteristics when pre-sample hold is performed.

As shown in FIG. 3, it is known that the ceramic capacitor, when a DC voltage is applied thereto, an effective electrostatic capacity decreases. In addition, there is also known a phenomenon that ceramic capacitor changes to a characteristic based on the decreased capacity as indicated by a dotted line once ceramic capacitor is subjected to voltage application, and discharging after charging.

Therefore, once the DC voltage is applied to the ceramic capacitor to charge, discharging after charging once stops can thus change characteristics from real line to dotted line in FIG. 3. As clear from FIG. 3, the characteristic of the dotted line is more moderate than that of the real line in the change of static capacitance change rate due to voltage change. That is, changing the characteristics by the pre-sample hold operation and performing sample and hold for the actual measurement can reduce the influence of voltage drop of the capacitor due to leakage current.

In the case of the configuration shown in FIG. 1, the pre-sample and hold of the second capacitor 114 is performed (Steps S130 and S140) while pre-sample hold of the first capacitor 113 is performed (step S110, S120), and sample and hold for actual measurement of the first capacitor 113 is performed (Step S150, S160). During the pre-sample and hold of second capacitor 114, charging of the first capacitor 113 is stopped. This pre-sample and hold of the second capacitor 114 results in that the first capacitor 113 leaves an interval between the pre-sample hold and sample hold for actual measurement. That is, the application of the third voltage is stopped and a predetermined time elapses, and the discharge is caused by the leak current during this interval. Therefore, the first capacitor 113 changes in the DC bias characteristic from the solid line to the dotted line in FIG. 3 at the time of sample holding for actual measurement.

The same applies to the second capacitor 114. During pre-sample and hold of the second capacitor 114 (Steps S130 and S140) and sample hold for actual measurement (S170 to S190), sample hold for actual measurement of the first capacitor 113 is performed (S150, S160). As a result, during the sample hold for the actual measurement of the first capacitor 113, charging of the second capacitor 114 is stopped. The second capacitor 114 leaves an interval between the pre-sample and hold and sample hold for actual measurement. That is, the application of the third voltage is stopped and a predetermined time elapses. Therefore, the first capacitor 114 changes in the DC bias characteristic from the solid line to the dotted line in FIG. 3 at the time of sample holding for actual measurement.

The interval (predetermined time) between this pre-sample and hold and the sample hold for actual measurement is preferably such one that the converted DC bias characteristic does not return to the original characteristic, for example, the capacitor is not fully discharged. In addition, during pre-sample and hold, the capacitor is not necessary to store up to the upper limit of the capacity. In short, as shown in FIG. 3 it suffices that the DC bias characteristic may change by pre-sample and hold, and the predetermined time, the capacity to be charged, and the like may be obtained through experiment for example.

According to the present embodiment, the μCOM 140 controls the changeover switch 112 so that the first capacitor 113 has the same voltage as the first voltage, and then controls the changeover switch 112 so that the third capacitor 114 has the same voltage as the first voltage, and application of the first voltage to the capacitor 113 stops. Then the changeover switch 112 is controlled so as to introduce the first voltage to the first capacitor 113. Thus, it is possible to derive the first voltage or the second voltage after changing the DC bias characteristic of the ceramic capacitor. Therefore, increase in electrostatic capacitance accompanied by voltage drop due to the leakage current due to the influence of the DC bias characteristics of the ceramic capacitor can be suppressed, and further decrease of the voltage drop across the capacitor is reduced, which suppresses a decrease in measurement accuracy of the voltage difference between the first voltage and the second voltage. Also, since ceramic capacitors are used, cost reduction and down-seize of the device can be achieved.

In addition, increase of the capacitance of the first capacitor 113 can reduce the voltage drop due to charge escape while accumulating charges by the second capacitor 114, and reduction of the capacity of the capacitor 114 can shorten the storage period of the second capacitor 114. As a result, the differential voltage can be detected in a state where the first voltage of the first capacitor 113 does not decrease, which improves the measurement accuracy.

In the above-described embodiment, the voltage (third voltage) which the first capacitor and the second capacitor hold during pre-sample and hold is the same voltage as the first voltage, but may be the same voltage as the second voltage, or may be a voltage different from these voltages. That is, as shown in FIG. 3, by performing pre-sample and hold, the DC bias characteristic of the ceramic capacitor may be changed.

Further, in the above-described embodiment, pre-sample and hold is performed to both the first capacitor 113 and the second capacitor 114, but it may be performed only to one of them. For example it may be performed to only the first capacitor 114 having a longer standby time. While pre-sample and hold to both sides preferably changes the DC bias characteristics of the two capacitors, even performing only to one of them can reduce decrease of the voltage across the capacitor due to the influence of the DC bias characteristic even not so much as to perform pre-sample and hold on both.

Figure 4:
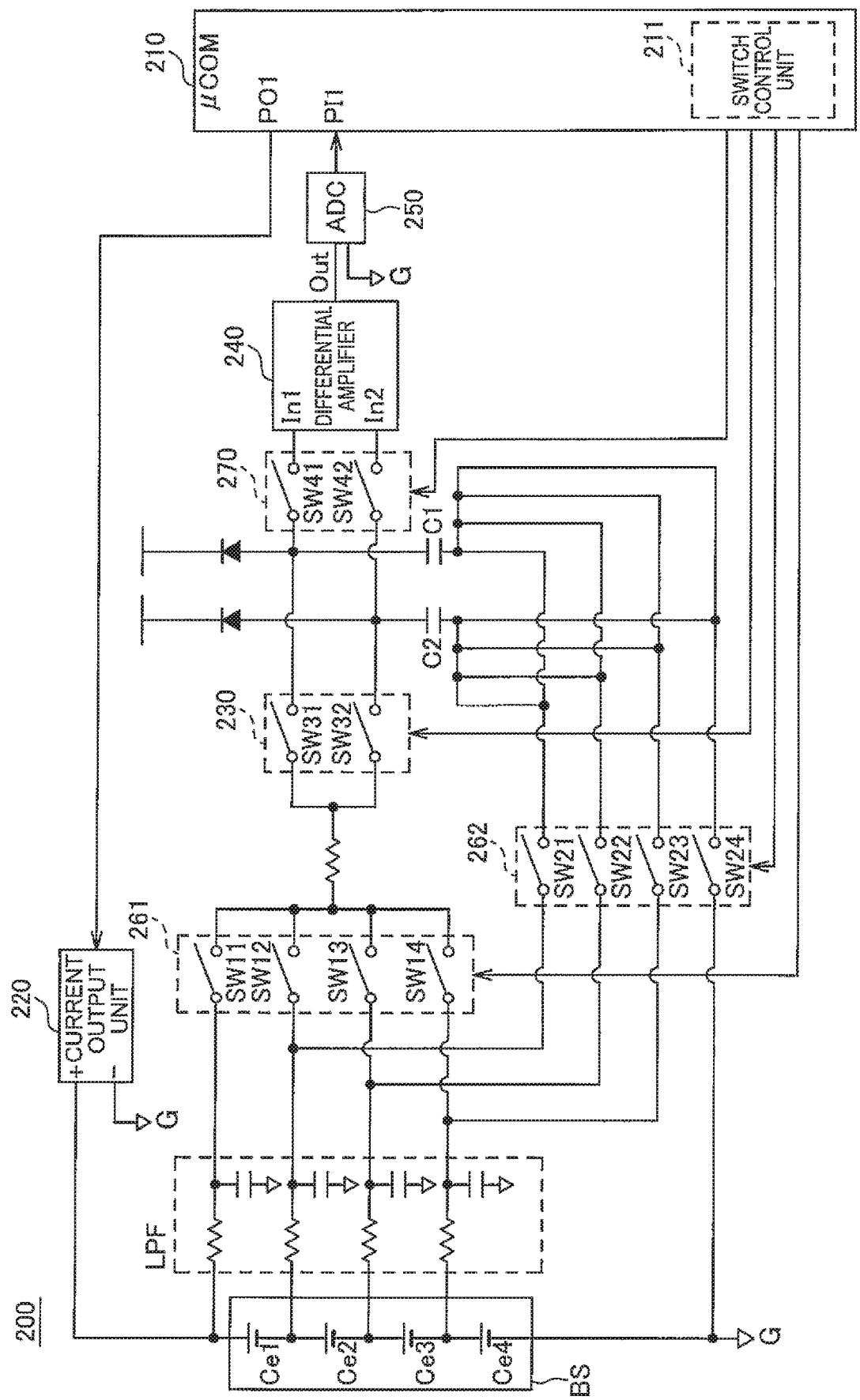
FIG. 4 is a diagram showing a schematic configuration of a differential voltage measuring apparatus according to a second embodiment.

Next, a second embodiment of the present invention will be described. FIG. 4 is a diagram showing an outline of a certain differential voltage measuring device of a second embodiment of the present invention. A differential voltage measuring apparatus 200 of the second embodiment is the one applied to a technology of the battery state detection device 100, and has a voltage source to measure an assembled battery BS in which a plurality of cell batteries (Ce1 to Ce4) is combined.

As shown in the drawing, the differential voltage measuring apparatus 200 includes a first capacitor C1, a second capacitor C2, μCOM 210, a current output unit 220, a changeover switch 230, a differential amplification unit 240, an ADC250, a detection object selection switch 261, a reference potential setting switch 262, and a protection switch 270.

The current output unit 220 supplies a constant current to the assembled battery BS based on a command from the μCOM 210. Switching the constant current flowing to the battery BS creates the first state and the second state of the assembled battery BS. Either the first state or the second state may be a state in which no current flows.

The first capacitor C1 holds as the first voltage the voltage of the part to be measured in the assembled battery BS in the first state. The second capacitor C2 holds as the second voltage the voltage of the part to be measured in the assembled battery BS in the second state. Here, the capacitance of the first capacitor C1 is designed to be larger than the capacitance of the second capacitor C2. However, the capacitance of the first capacitor C1 and the capacitance C2 may have the same capacity.

The changeover switch 230 is provided with a switch SW31 for guiding the voltage (first voltage) of the measurement target portion in the assembled battery BS in the first state to the first capacitor C1, and a switch SW32 for guiding the voltage (second voltage) of the measurement target portion in the assembled battery BS in the second state to the second capacitor C2.

The detection object selection switch 261 is provided between each cell battery (Ce1 to Ce4) constituting the assembled battery BS and the changeover switch 230. Specifically, between the end of the cell battery Ce1 corresponding to the positive electrode side of the assembled battery BS and the changeover switch 230, SW11 is provided, between the connection point of the battery cell Ce1 and the cell battery Ce2 and the changeover switch 230, SW12 is provided, between the connection point of the cell battery Ce2 and the cell battery Ce3 and the changeover switch 230, SW1 is provided, and between the connection point of the cell battery Ce3 and the cell battery Ce4 and the changeover switch 230, SW 14 is provided.

The reference potential setting switch 262 is a switch for setting the reference potential of the first capacitor C1 and the second capacitor C2. Specifically, provided are the SW24 for setting the reference potential of the first capacitor C1 and the second capacitor C2 to the reference potential G, the SW 23 for setting the reference potential of the first capacitor C1 and the second capacitor C2 to the voltage of the cell battery Ce4, the SW 22 for setting the reference potential of the first capacitor C1 and the second capacitor C2 to the voltage of the cell battery Ce4 plus the cell battery Ce3, and the SW 21 for setting the reference potentials of the first capacitor C1 and the second capacitor C2 to the cell battery Ce4 plus cell battery Ce3 plus cell battery Ce2.

The protection switch 270 is as a switch that protects the differential amplification unit 240 and also reduces leakage current to the differential amplifier 240 connected to the first capacitor C12 and the second capacitor C2. The protection switch 270 is a switch that leads the first voltage/second voltage to the differential amplifier 240 after completing the sample and hold for the first capacitor C1 and the second capacitor C2, and is provided with a switch SW41 disposed between the first capacitor C1 and the first input terminal In1, and a SW 42 disposed between the second capacitor C2 and the second input terminal In2. Both of SW41 and SW42 are turned off during sample and hold, and lead the first voltage and the second voltage to the differential amplifier 240 when sample and hold is completed.

Figure 5:
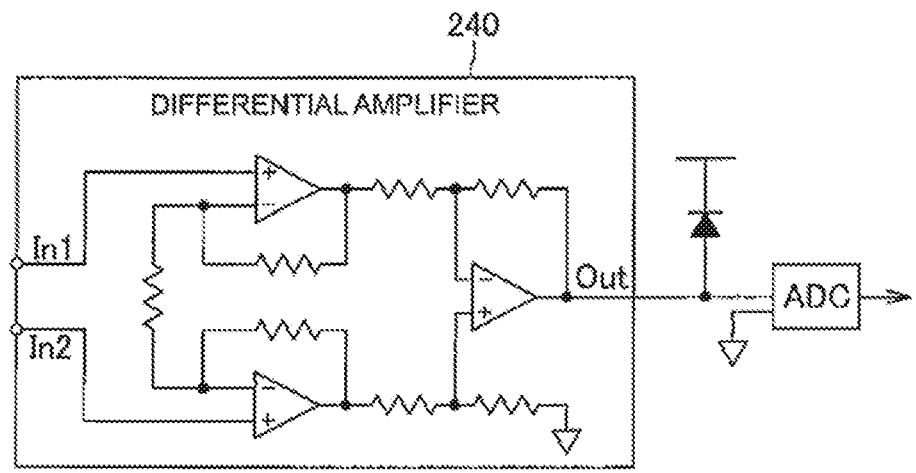
FIG. 5 is a circuit diagram showing an example of a differential amplifier.
Figure 6:
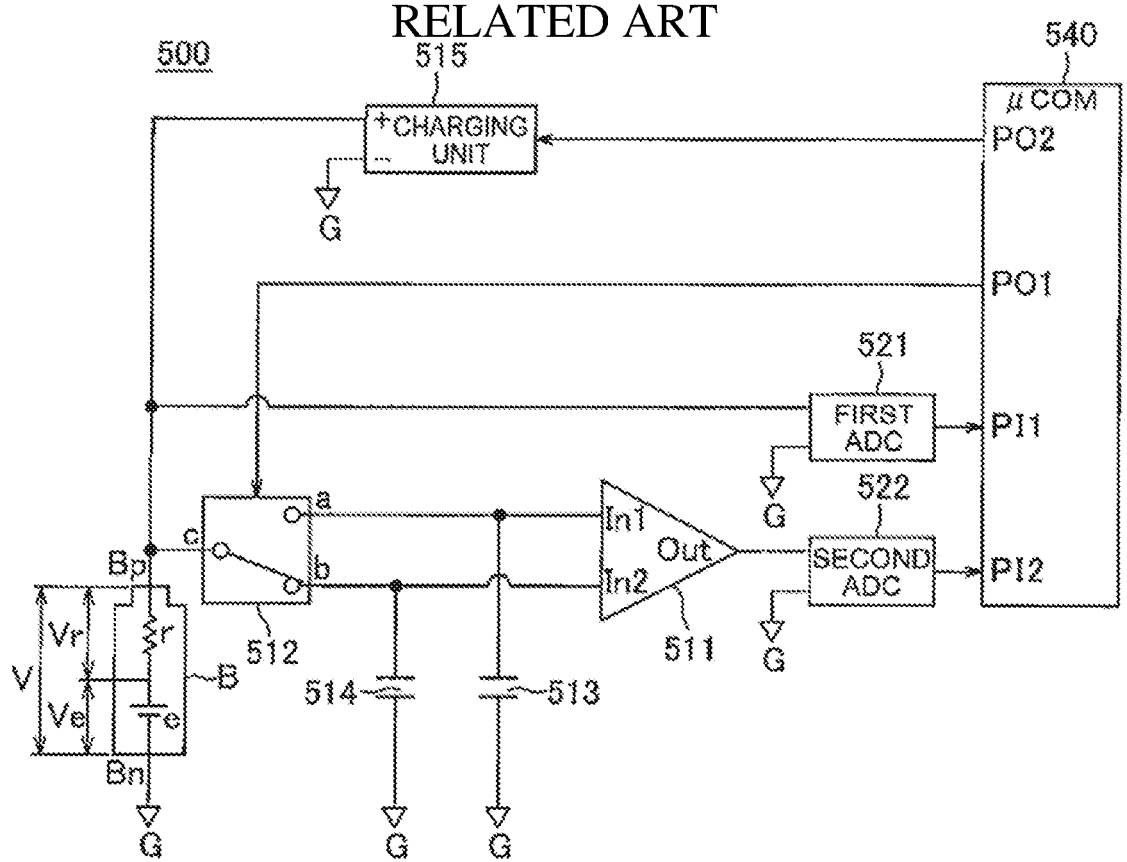
FIG. 6 is a diagram showing a schematic configuration of a conventional battery state detection device.

The differential amplifier 240 has two input terminals (a first input terminal In1 and a second input terminal In2) and one output terminal (output terminal Out), and outputs the amplified voltage Vm from the output terminal where the voltage input to these two input terminals is amplified with a predetermined amplification factor Av. The differential Amplification unit 240 can be constituted by, for example, an operational amplifier or a circuit shown in FIG. 5.

The ADC 250 quantizes the amplified voltage Vm output from the differential amplifier 240, and outputs a signal indicating a digital value corresponding to the amplified voltage Vm.

The μCOM 210 has a built-in CPU, ROM, RAM, and the like, and functions as a control unit to control the entire differential voltage measuring apparatus 200. The μCOM 210 is provided with a first output port PO1 connected to the input port 20, a first input port PI1 to which a signal output from the ADC 250 is input, and a switch control unit 211 for controlling each switch.

The differential voltage measuring apparatus 200, by measuring the internal resistance of each cell battery, for example, can obtain the SOH for each cell battery. A case where the internal resistance of the cell battery Ce1 is measured will be described. First, in order to perform pre-sample and hold, the SW11 of the detection object selection switch 261 is switched ON, and turns on only the SW 21 of the reference potential setting switch 262. Thus, the voltage between both terminals of Ce1 will be led to capacitor C1 and capacitor C2.

Then, a predetermined first constant current I1 is caused to flow from the current output section 220 as the first state, and the changeover switch SW31 of the changeover switch 230 is only turned on. As a result, the pre-sample and hold for the capacitor C1 is performed, and the voltage of the cell battery Ce1 is held in the first capacitor C1.

Next, SW31 of the changeover switch 230 is turned off and SW32 is turned on. In this way, pre-sample and hold of the capacitor C2 is performed, and the voltage of Ce1 is held in the second capacitor C2.

Next, sample and hold for actual measurement is performed. The SW32 of the changeover switch 230 is turned off, and the SW31 is turned off. As a result, the voltage of the battery Ce1 is held in the first capacitor Ce1 as the first voltage is charged with the cell.

Next, a predetermined second constant current I2 is caused to flow from the current output unit 220 as the second state, and the changeover switch SW31 of the SW230 is turn off and the SW32 is turned on. As a result, the voltage of the cell battery Ce1 in the second state is held in the second capacitor C2 as the second voltage.

When the protection switch 270 is turned on to lead the first voltage and the second voltage to the differential amplifier 240, the voltage difference is input to the μCOM210. The μCOM210, by the same principle as that in the first embodiment, can obtain the internal resistance r1 of the cell battery Ce1 through expression of $r1=(Vm/Av)/(I1-I2)$. The internal resistance of other cell batteries can also be similarly obtained.

In the case of detecting the differential voltage with respect to the assembled battery BS as in the present embodiment, voltage drop caused by contact resistance and wiring resistance of connecting members such as bus bars provided for connecting each cell may be detected. Therefore, contact resistance and wiring resistance of the connection member are measured in advance, and the voltage drop due to the influence of the connecting member may be subtracted from the detected difference voltage. For example, assume that the true differential voltage is $\Delta V$, the detected differential voltage is $Vm/Av$, the contact resistance of the connecting member and wiring resistance is R, it is obtained as $\Delta V=(Vm/Av)-R\times(I1-I2)$. Then, by obtaining the internal resistance r1 based on this true differential voltage $\Delta V$, the detection accuracy can improve.

Also in the second embodiment, because the pre-sample and hold is performed, the change of the electrostatic capacitance change rate due to the voltage change with respect to the DC bias characteristic of the ceramic capacitor is gently changed, thereby reducing the drop in the voltage across the capacitor due to the influence of the DC bias characteristic, which reduces the influence of the voltage drop of the capacitor due to the leak currency.

Further, since the capacity of the first capacitor C1 is increased and the capacity of the second capacitor C2 is decreased, the voltage drop of the first capacitor C1 while the second capacitor C2 accumulates charges can be reduced, thereby improving the measurement accuracy of the difference voltage between the first voltage and the second voltage.

In the second embodiment, since the switch control unit 211 operates the detection object selection switch 261 and the reference potential setting switch 262, various potential differences can be measured.

For example, the current output unit 220 does not pass a current, and with only the SW21 in the reference potential setting switch 262 turned on, and only the SW11 in the detection object selection switch 261 turned on, the first voltage is obtained, after that, with only the SW12 in the detection object selection switch 261 turned on, the second voltage is obtained, and the difference voltage between the first voltage and the second voltage is measured, the measurement result indicates both ends of the cell battery Ce1, that is, the voltage of the cell battery Ce1. The voltage of other cell batteries can be obtained in the same way.

Also in this case, by performing the pre-sample and hold before obtaining the first voltage, the capacitance change rate due to voltage change with respect to the DC bias characteristic of the ceramic capacitor is gradually changed, thereby reducing the drop in the voltage across the capacitor due to the influence of the DC bias characteristic, which reduces the influence of the voltage drop of the capacitor due to the leak current.

Further, since the capacity of the first capacitor C1 is increased and the capacity of the second capacitor C2 is decreased, the voltage drop of the first capacitor C1 while the second capacitor C2 accumulates charges can be reduced, which improves the measurement accuracy of the difference voltage between the first voltage and the second voltage.

Although the present invention has been described with reference to the first and second embodiments, the difference voltage measurement apparatus is not limited to the configuration of these embodiments.

For example, in each of the above-described embodiments, regarding the first constant current I1 and the second constant current I2, currency flowing from the charging unit 115 or the current output unit 220 charges the secondary battery B, but the load current generated by the load connected to the secondary battery B may discharge the battery B.

It is to be noted that the above-described embodiment merely shows a representative form of the present invention, it is not limited to the state. That is, those skilled in the art will appreciate that, in accordance with knowledge hitherto known, various modifications can be made without departing from the scope of the invention. As long as such a deformation has the configuration of the differential voltage measuring device of the present invention, it is of course within the scope of the present invention.

DESCRIPTION OF SYMBOLS 100 battery condition detection device (differential voltage measurement device)
111 differential amplifier
112 changeover switch
113 first capacitor
114 second capacitor
115 charging unit (current output section)
121 first ADC
122 second ADC
140 μCOM (control unit)
200 differential voltage measuring device
210 μCOM (control unit)
211 switch control unit
220 current output unit
230 changeover switch
240 differential amplifier
250 ADC
261 detection object selection switch
262 reference potential setting switch
270 protection switch
C1 first capacitor
C2 second capacitor

The invention claimed is:

1. A difference voltage measuring device for detecting voltage of a battery comprising:
    a first capacitor and a second capacitor, each formed of a ceramic capacitor;
    a differential amplifier for outputting a voltage corresponding to a difference voltage between a voltage held by the first capacitor and a voltage held by the second capacitor, and
    a controller configured to apply a first voltage to the first capacitor, apply a second voltage to the second capacitor with the first capacitor holding the first voltage, and detect an output of the differential amplifier corresponding to the differential voltage of the first voltage and the second voltage while the first capacitor holds the first voltage and the second capacitor holds the second voltage,
    wherein:
    in a first time period, the controller applies a third voltage to the first capacitor,
    in a second time period following the first time period, the controller stops applying the third voltage to the first capacitor, and applies the third voltage to the second capacitor, and the first capacitor is discharged,
    in a third time period following the second time period, the controller stops applying the third voltage to the second capacitor, and applies the first voltage to the first capacitor; and
    in a fourth time period following the third time period, the controller stops applying the first voltage to the first capacitor and applies the second voltage to the second capacitor.

2. The difference voltage measuring device according to claim 1, wherein
    the second capacitor has a smaller capacity than that of the first capacitor.

3. The difference voltage measuring device according to claim 2, wherein
    the controller is further configured to control a switch to exclusively switch a connection destination of an input terminal to which voltage is applied to either the first capacitor or the second capacitor, so as to apply the first voltage or the third voltage to the first capacitor, and with the first capacitor holding the first voltage or the third voltage, and apply the second voltage or the third voltage to the second capacitor.

4. The difference voltage measuring device according to claim 3, further comprising
    a current output circuit configured to switch to output, a first current supplied to generate the first voltage, a second current supplied to generate the second voltage, and a third current supplied to generate the third voltage.

5. The difference voltage measuring device according to claim 2, further comprising
a current output circuit configured to switch to output, a first current supplied to generate the first voltage, a second current supplied to generate the second voltage, and a third current supplied to generate the third voltage.

6. The difference voltage measuring device according to claim 1, wherein
the controller is further configured to control a switch to exclusively switch a connection destination of an input terminal to which voltage is applied to either the first capacitor or the second capacitor, so as to apply the first voltage or the third voltage to the first capacitor, and with the first capacitor holding the first voltage or the third voltage, and apply the second voltage or the third voltage to the second capacitor.

7. The difference voltage measuring device according to claim 6, further comprising
a current output circuit configured to switch to output, a first current supplied to generate the first voltage, a second current supplied to generate the second voltage, and a third current supplied to generate the third voltage.

8. The difference voltage measuring device according to claim 1, further comprising
a current output circuit configured to switch to output, a first current supplied to generate the first voltage, a second current supplied to generate the second voltage, and a third current supplied to generate the third voltage.

9. The difference voltage measuring device according to claim 1, wherein the first capacitor is discharged by leak current.

10. The difference voltage measuring device according to claim 1, wherein the third voltage is a pre-charging voltage.

11. The difference voltage measuring device according to claim 1, wherein in the third time period the second capacitor is discharged by leak current.

* * * * *